(12) United States Patent
Chan et al.

(10) Patent No.: US 9,685,336 B1
(45) Date of Patent: Jun. 20, 2017

(54) PROCESS MONITORING FOR GATE CUT MASK

(71) Applicant: GLOBALFOUNDRIES Inc., Grand Cayman (KY)

(72) Inventors: Nigel Chan, Dresden (DE); Elliot John Smith, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/055,954

(22) Filed: Feb. 29, 2016

(51) Int. Cl.
*H01L 21/66* (2006.01)
*H01L 21/28* (2006.01)
*H01L 21/033* (2006.01)

(52) U.S. Cl.
CPC .... *H01L 21/28123* (2013.01); *H01L 21/0335* (2013.01); *H01L 21/0337* (2013.01); *H01L 21/0338* (2013.01); *H01L 22/12* (2013.01); *H01L 22/26* (2013.01)

(58) Field of Classification Search
CPC ........... H01L 21/28123; H01L 21/0335; H01L 21/0337; H01L 21/0338; H01L 22/12; H01L 22/26
See application file for complete search history.

(56) References Cited

U.S. PATENT DOCUMENTS

| | | | | |
|---|---|---|---|---|
| 5,902,704 A * | 5/1999 | Schoenborn | ............... | G03F 7/36 257/E21.026 |
| 6,928,635 B2 * | 8/2005 | Pramanik | ............ | G06F 17/5081 716/53 |
| 7,301,645 B2 * | 11/2007 | Wang | ....................... | H01L 22/20 257/E21.525 |
| 7,306,746 B2 * | 12/2007 | Chen | ................. | H01L 21/31116 216/59 |
| 7,588,946 B2 * | 9/2009 | Tso | ......................... | H01L 22/12 257/E21.528 |
| 8,877,642 B2 * | 11/2014 | Hu | .................... | H01L 29/66545 257/E21.214 |

* cited by examiner

*Primary Examiner* — Bac Au
(74) *Attorney, Agent, or Firm* — Amerson Law Firm, PLLC

(57) ABSTRACT

A method of monitoring critical dimensions of gate electrode structures is provided including providing a substrate, forming a gate electrode pattern on the substrate comprising forming gate electrode lines parallel to each other, forming a mask layer on the gate electrode pattern and forming openings in the mask layer in a crosswise direction with respect to the direction of the parallel gate electrode lines, thereby exposing portions of the gate electrode pattern, etching exposed portions of the gate electrode pattern through the mask layer openings, thereby obtaining a negative image of the mask layer openings, removing remaining portions of the mask layer, and monitoring dimensions of the mask layer openings.

17 Claims, 5 Drawing Sheets

FIG. 3A
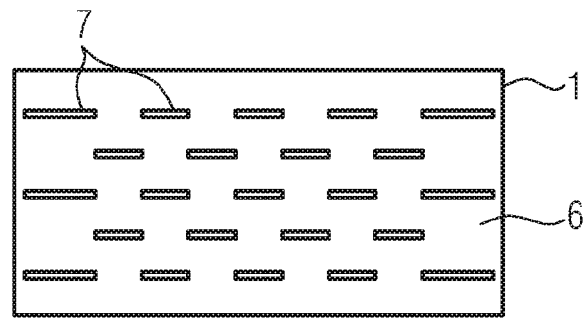
FIG. 3B
(prior art)
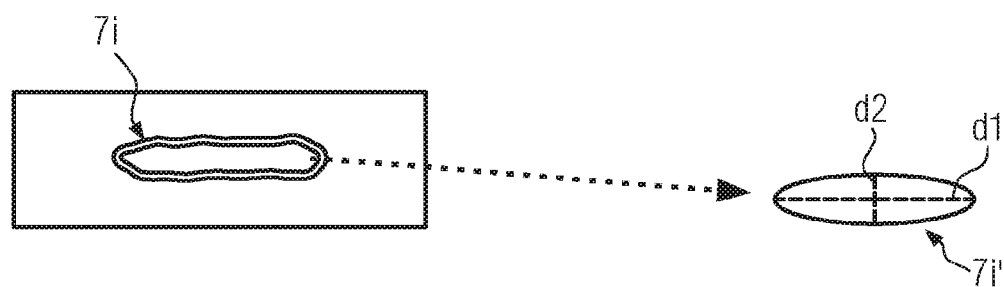
FIG. 3C
(prior art)
FIG. 3D

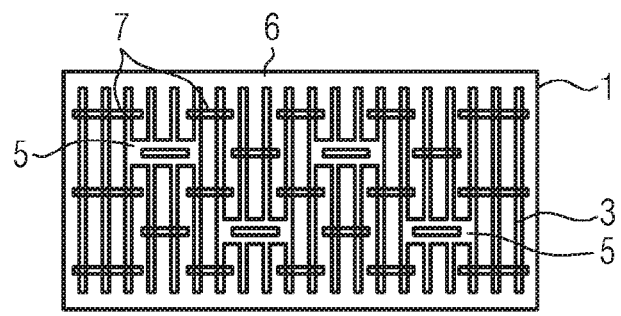
FIG. 4
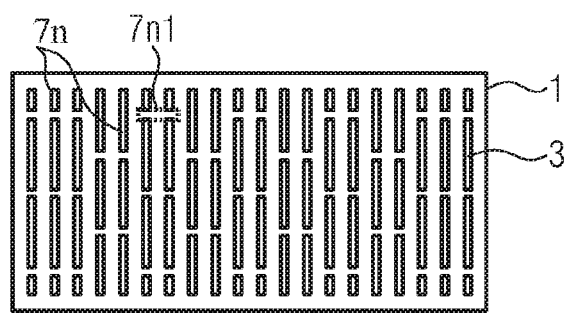
FIG. 5A
(prior art)
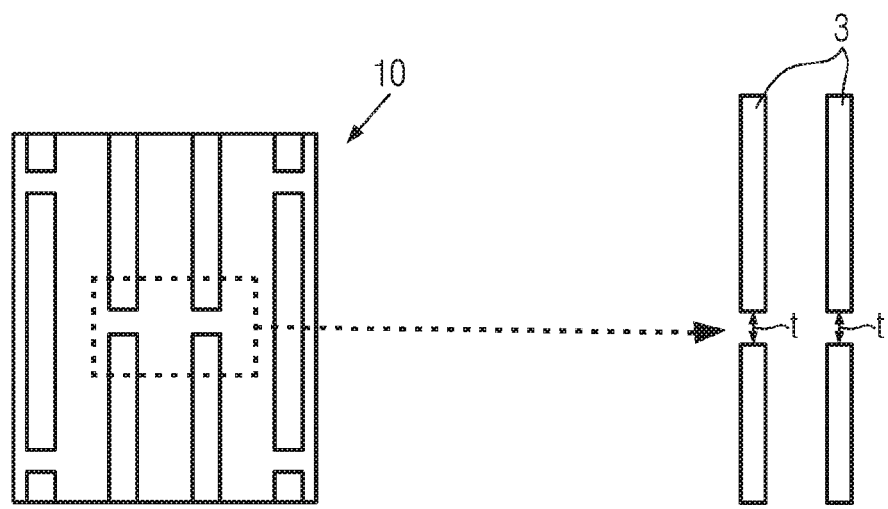
FIG. 5B
(prior art)
FIG. 5C

PROCESS MONITORING FOR GATE CUT MASK

BACKGROUND OF THE INVENTION

1. Field of the Invention

Generally, the present disclosure relates to the field of manufacturing of integrated circuits and semiconductor devices, and, more particularly, to a pre- or post-manufacturing monitoring process for gate cut masks, for example, within the context of SRAM design as well as manufacturing in Fully Depleted Silicon On Insulator (FDSOI) technology.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

Photolithography, also termed optical lithography or UV lithography, is a process used in microfabrication to pattern parts of a thin film or the bulk of a substrate. It uses light to transfer a geometric pattern from a photomask to a light-sensitive chemical "photoresist," or simply "resist," on the substrate. A series of chemical treatments then either engraves the exposure pattern into, or enables deposition of a new material in the desired pattern upon, the material underneath the photoresist.

Within photolithography, and owing to the fact that an ever persisting aggressive downscaling is present, for example, in the context of sub-28-nm or even sub-22-nm Very Large Scale Integrated (VLSI) Circuits CMOS technologies, one of the most important parameters is the critical dimension (CD) of devices formed on wafers. The critical dimension is the minimum feature size on the various structures formed on a wafer. This corresponds to the dimensions of the smallest geometrical features, such as interconnect line, contacts, trenches, fins, gates, etc., which may be formed during semiconductor device/circuit manufacturing using a given technology. It is also common to write two times the half-pitch. The CD generally corresponds to the linewidth of the photoresist line printed on the wafer. It reflects whether the exposure and development are properly chosen to produce geometries of the correct size. As such, the CD is an important control means.

For an exposure process to pattern a device correctly, the critical dimensions (CDs) of all critical structures in the device must be patterned to achieve the design target dimensions. When a resist used in the exposure process is exposed by a projected image and thereafter baked and developed, the resist tends to undergo complex chemical and physical changes. The final resist patterns are typically characterized by their CDs, usually defined as the width of a resist feature at the resist-substrate interface. While the CD is usually intended to represent the smallest feature being patterned in the given device, in practice, the term CD is often used to describe the line width of any resist feature.

Since it is practically impossible to achieve every target CD with no errors, the device is designed with a certain tolerance for CD errors. The resulting pattern is considered to be acceptable if the CDs of all critical features are within these predefined tolerances. For the exposure process to be viable in a manufacturing environment, the full CD distribution must fall within the tolerance limits across a range of process conditions that represents the typical range of process variation expected to occur during the manufacturing process.

The range of process conditions over which the CD distribution will meet the specification limits is referred to as the "process window." The term "nominal" may refer to the center of a process window and may be defined by the best focus and best exposure dose. At best focus, the CD and edge placement error may be equal to predetermined target values.

The process window conditions take into consideration various process variations. In lithography processing, process window conditions typically have variations in dose (relative to nominal dose), focus (relative to nominal focus) and mask bias offsets. A process may be considered to have a manufacturable process window if the CDs fall within the tolerance limits, e.g., ±10% of the nominal feature dimension, over a range of focus and exposure conditions which are expected to be maintainable in production, for example.

Conventional manufacture of semiconductors may include a preparation of a wafer, i.e., a substrate, application of structures or pre-structures on the substrate, followed by a preparation of a photoresist and/or a mask above the structures. After exposure, such as exposure to UV light, development and removing of the photoresist, a measurement of CD usually suffers from poor resolution due to the material properties of the photoresist. After an etching step, removing at least parts of the mask CD is often only monitorable as a tip-to-tip measurement. To achieve a systematic, structural learning process, it is often needed to omit certain specific structures from the preparation process in order to enable better visibility of CD structures.

Therefore, there is a need to improve the monitoring of CD structures after a mask opening step so as to improve the visibility and resolution of CD structures in order to ultimately facilitate shrink development.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to a method of monitoring critical dimensions of gate electrode structures including providing a semiconductor substrate, forming a gate electrode pattern on the substrate comprising forming gate electrode lines parallel to each other, forming a mask layer on the gate electrode pattern and forming openings in the mask layer, called mask shapes or mask openings, in a crosswise direction with respect to the direction of the parallel gate electrode lines, thereby exposing portions of the gate electrode pattern, etching exposed portions of the gate electrode pattern through the mask shapes, thereby obtaining a negative image of the mask shapes, removing remaining portions of the mask layer, monitoring dimensions of the mask shapes, i.e., the negative image of the mask shapes, wherein forming the gate electrode pattern comprises forming additional gate electrode shapes in a crosswise direction with regard to the parallel gate electrode lines, the additional gate electrode shapes being geometrically similar to and having a larger area than the mask shapes such that a predetermined fraction of the mask shapes are completely overlying the additional gate electrode shapes when forming the mask shapes.

BRIEF DESCRIPTION OF THE DRAWINGS

The disclosure may be understood by reference to the following description taken in conjunction with the accompanying drawings, in which like reference numerals identify like elements, and in which:

FIG. 3A illustrates openings in a mask layer according to the art;

FIG. 3B illustrates an image resulting of a CD structure obtained from the openings in the mask layer of FIG. 3A;

FIGS. 3C-3D illustrate the dimensions of the CD structure of FIG. 3B;

FIG. 4 illustrates an overlay of the structures of FIGS. 2 and 3;

FIGS. 5A-5C illustrate tip-to-tip measurements of CD structures according to the art;

Figure 1A:
FIGS. 1A-1B illustrate a gate electrode pattern on a substrate of the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It is expressly stated that, as used herein, the term "adjacent" when used without further specification covers (a) neighbored with a small gap (with a width smaller than the width, in particular, smaller than 20% of the width, of a smaller one of the first and second raised semiconductor regions) in between, (b) directly adjacent without a gap, i.e., in direct mechanical contact with each other, and (c) overlapping with each other.

As will be readily apparent to those skilled in the art upon a complete reading of the present application, the present methods are applicable to a variety of technologies, e.g., NMOS, PMOS, CMOS, etc. The techniques and technologies described herein can be utilized to fabricate MOS integrated circuit devices, including NMOS integrated circuit devices, PMOS integrated circuit devices, and CMOS integrated circuit devices.

FIG. 1A illustrates, for explanatory purposes, a simplified side view of a gate electrode pattern 3 formed on a substrate 1 of the prior art. The gate electrode pattern 3 or PC pattern 3 may be loosely also denominated as a gate electrode pattern layer 3, when viewing the side view of FIG. 1A. It should be understood that the dimensions and in particular the thicknesses of the substrate 1 shown in FIG. 1A are not to scale.

Figure 1B:
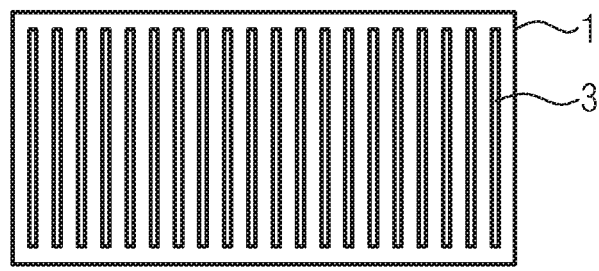

FIG. 1B shows a top view of the configuration shown in FIG. 1A, where, within the context of manufacturing a semiconductor substrate, FIG. 1B discloses a semiconductor substrate 1. The gate electrode pattern, called PC pattern, denoted by reference number 3, is formed on the semiconductor substrate 1. The shape of the substrate 1 may be substantially rectangular as shown in FIG. 1B but it should be understood that other shapes of the substrate may be possible. The PC pattern as illustrated in FIGS. 1A, 1B comprises parallel lines. The parallel lines of the PC pattern shown in FIG. 1B are oriented in a lengthwise direction. This direction may also be called a vertical direction within the plane. With regard to further steps, see below, it should be understood that in fact only the relative orientation of structures to each may matter, e.g., in a further step, see FIGS. 4 and 6A, structures may be oriented substantially orthogonal to the parallel lines of the PC pattern shown in FIG. 1B. The parallel lines of the PC pattern of FIG. 1B have a substantially uniform pitch. It should be noted that, in principle, a non-uniform pitch may also be possible (not shown).

Figure 2A:
FIGS. 2A-2B illustrate a modified gate electrode pattern including additional gate electrode shapes.
Figure 2B:
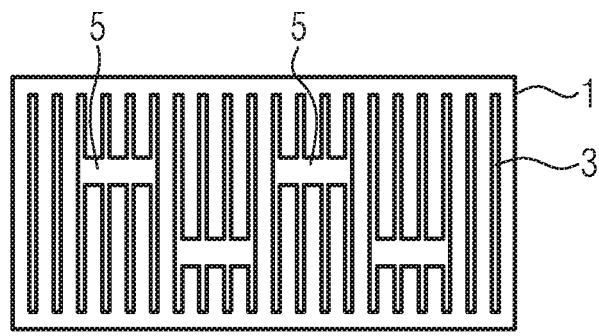

FIGS. 2A and 2B illustrate a modified gate electrode (PC) pattern including additional gate electrode pattern shapes, for brevity called additional gate electrode shapes, which are also called additional PC shapes. FIG. 2A shows a similar configuration of stacking of layers as in FIG. 1A. FIG. 2B shows a corresponding top view with respect to FIG. 2A. Thus, FIG. 2B illustrates a modification of the step of providing a PC pattern as illustrated in FIGS. 1A, 1B. The semiconductor substrate may be one of an SOI and FDSOI substrate.

In FIG. 2B, further to providing the substrate 1 and the PC pattern 3, i.e., PC lines of FIG. 1B, additional gate electrode shapes 5, which may also be denominated as additional gate electrode shapes 5 or PC shapes 5, are provided. These additional PC shapes 5 typically are provided together with the PC pattern 3. Each of the PC shapes 5 are of a substantially rectangular shape. These shapes typically have a length in the lengthwise direction, i.e., parallel to the PC lines 3, and a width in the crosswise direction, i.e., perpendicular to the PC pattern 3, i.e., the PC lines, within the plane of the substrate 1. The width of each of the PC shapes 5 may be a multiple n of the pitch of the PC pattern 3, where n is an integer number larger than or equal to 1. Typically the length of each of the PC shapes 5 is smaller than its corresponding width. Typically, each of the PC shapes 5 has the same size; although in principle (not shown) different sizes may be possible. The size of the PC shapes 5 typically may be chosen under a condition as will be explained with respect to FIG. 4.

The material of the PC pattern 3, i.e., the PC lines, and the PC shapes 5 may include at least one of polysilicon, amorphous silicon nitride, oxides, metal silicide or metals.

FIG. 3A represents a side view of a simplified illustration of a mask layer 6, also called a polycut layer or CT layer, formed on the PC pattern 3 or the PC pattern 3 and the PC shapes 5 of FIGS. 1A, 1B and 2A, 2B, respectively. FIG. 3B illustrates a corresponding top view of the configuration shown in FIG. 3A. FIG. 3B illustrates openings 7 in the CT layer 6 according to the prior art. These openings 7 may also be called CT shapes 7 of the CT layer 6. The openings 7 in the CT layer 6 are provided in the crosswise direction with respect to the PC pattern 3 shown in lengthwise direction in FIGS. 1B and 2B. The opening 7 may have a substantially oblong or slot-like or slit-like shape, although other shapes may be possible, as well. The relative orientation of the openings 7 in the CT layer 6 of FIG. 3B is orthogonal to the PC pattern 3 of FIGS. 1B and 2B. The length of the openings 7 illustrated in FIG. 3B may vary. FIG. 3B shows an example of two different lengths, e.g., longer openings towards the short edges of the CT layer 6 upon the substrate 1 and shorter openings towards the middle of the CT layer 6 upon the substrate 1.

The material of the CT layer 6 may comprise at least one of a photoresist, a planarization layer, an anti-reflective layer, or a hardmask.

The CT layer 6 of FIGS. 3A, 3B may cover the entire PC pattern 3 or the PC pattern 3 and the PC shapes 5, respectively, of FIGS. 1A, 1B and 2A, 2B, which are formed on the substrate 1 as shown in FIGS. 1A, 2A.

The step of forming the CT layer 6 on the PC pattern includes lithographic patterning of a prepared mask layer.

After lithographic patterning the structure shown in FIGS. 3A and 3B, FIG. 3C illustrates a top view of an image 7i resulting from one opening in the CT layer 6 to be used for monitoring a CD structure of the semiconductor element to be manufactured. The image 7i, however, represents a blurred, fuzzy and distorted image of the shape of the CD structure. FIG. 3D illustrates the dimensions of a geometrical drawing 7i' which is geometrically similar to the CD structure as represented by the image 7i of the opening of the CT layer 6 of FIG. 3C. Thus the oblong or cigar-like shape of drawing 7i' exhibits a long axis d1 and a short axis d2 which represent structural information in two directions corresponding to two dimensions of the CD structure. Measuring d1 and d2 from the image 7i, however, would result in large measurement errors due to the distortion and blurriness of the image 7i at this stage. Additionally, the position of the CT layer cannot be measured relative to the PC below, an important metric to ensure electrical functionality of the device.

FIG. 4 illustrates a top view of an overlay of the structures of FIGS. 2B and 3B. FIG. 4 thus serves as an illustration of projection of the openings 7 of the CT layer 6 of FIG. 3B onto the PC patterns 3 and PC shapes 5 of FIG. 2B. In other words, whereas the stacking of layers is as shown in FIG. 3A, FIG. 4 shows their projection onto each other and into one geometrical plane only.

FIG. 4 thus illustrates a condition for the arrangement of the additional PC shapes 5 of the PC pattern 3 and PC shapes 5, relative to the CT shapes 7 of the CT layer 6. At least some of the additional PC shapes 5 are chosen such that a predetermined fraction of CT shapes 7 will be completely overlying the PC shapes 5, as shown in the projection of FIG. 4. In other words, the predetermined fraction of CT shapes 7 will completely land on the PC pattern 5. It should be understood that, in principle, this condition could also be fulfilled by tailoring the CT shapes 7 relative to given PC patterns. Here, overlying as well as landing should be understood as follows. The additional PC shapes 5 of FIGS. 2B, 4 share the crosswise direction with the CT shapes 7 of FIGS. 3B and 4, i.e., both the PC shapes 5 and the CT shapes 7 have the same direction relative to the PC lines of the PC pattern 3 of FIGS. 2B and 4. Then, both the width and the length of the PC shapes 5 each are larger than the length and the width of CT shapes 7 such that when the PC shapes 5 and the CT shapes 7 are aligned to the short edges of the PC shapes 5, the corresponding CT shape 7 will not project over any edge of the corresponding PC shape 5. In other words, each of the additional PC shapes 5 has a substantially rectangular shape with a width in crosswise direction of a multiple of a pitch size and a length in lengthwise direction larger than a corresponding width of the CT shapes 7.

Typically, however, the PC shapes 5 and the corresponding CT shapes 7 will share a common center point as shown in FIG. 4. The predetermined fraction of CT shapes 7 completely overlying the PC shapes 5 may be between 5-100%, in particular between 5-50%.

The predetermined fraction of all CT shapes 7 may be randomly distributed over the PC pattern 3 together with the PC shapes 5 such that also the predetermined fraction of CT shapes 7 completely overlying the PC shapes 5 may be randomly distributed. Furthermore, the corners of the PC shapes 5 may be chamfered or rounded. Moreover, the CT shapes 7 may be at least partially matched to functional SRAM patterns.

FIG. 5A illustrates tip-to-tip measurements of CD structures according to the prior art. Based on the PC lines of FIG. 1B and the CT openings of FIG. 3B, and after lithographic patterning, see FIGS. 3A-3D, structures such as shown as structures 7*n* result in the layer of the PC pattern 3. That is, some of the PC lines of the PC pattern 3 are intentionally interrupted or separated by the structures 7*n* as representing a separation of gate lines. The quality of such a separation as shown in FIG. 5A may be inspected after performing a so-called hard mask opening step, i.e., etching away the mask layer 6 and reducing the thickness of the PC layer 3, so as to be able to inspect the separation of gate lines. FIG. 5A illustrates a region 7*n*1 which may be inspected. FIG. 5B illustrates an image of such a region. The separation of PC lines of the PC pattern 3 by structures 7*n* may yield one-dimensional CD information by estimating or measuring a tip-to-tip distance t, as is depicted in FIG. 5C. Whereas the image quality shown in FIG. 5B may be better than that of FIG. 3C, nevertheless FIG. 5B suffers from the fact that only PC tip-to-tip measurements are possible. Any further information on CD so far needed a modified work flow such as skipping PC to enable CD visibility as in a region 7*n*1 altogether.

Figure 6A:
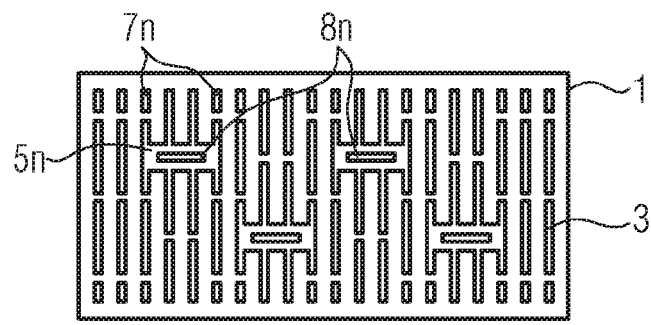
FIGS. 6A-6C illustrate CD structures after mask opening taking into account FIGS. 2, 3 and 4.
Figure 6B:
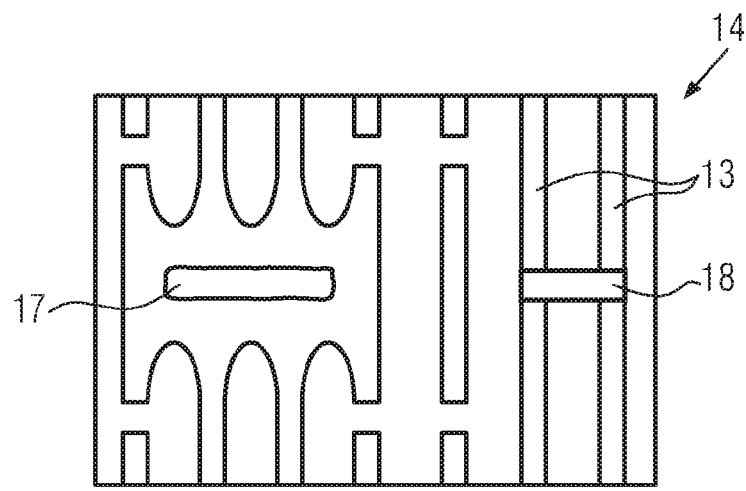
Figure 6C:
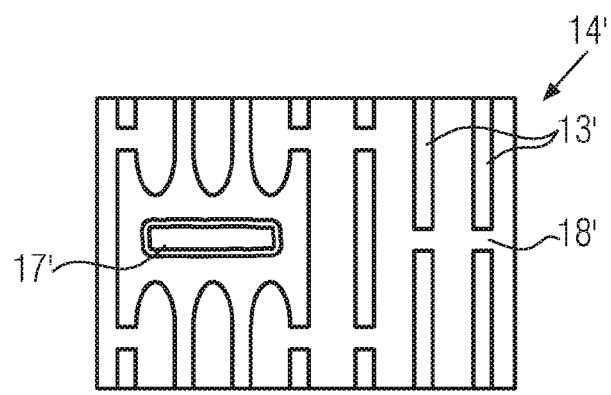

FIGS. 6A-6C illustrate CD structures after mask opening taking into account FIGS. 2B, 3B and especially 4. Thus by taking into account the CT shapes 7 of FIG. 4 completely overlying the additional PC shapes 5 of FIG. 2B, a modified and improved result may be obtained. FIG. 6A shows similar structures 7*n* as shown in FIG. 5A. These may provide for tip-to-tip measurements as explained with regard to FIGS. 5B and 5C. However additionally, structures 5*n* are shown. Structures 5*n* include negative images 8*n* of such CD shapes 7 of FIG. 4 which were completely overlying the PC shapes 5 of FIGS. 2B and 4. Thus, areas 8*n* now may provide two-dimensional CD information from CT shapes 7. Thus, the step of monitoring dimensions of the areas 8*n*, representing CT shapes 7, may include measurement of the length and the width of the area 8*n* so as to derive two-dimensional, precise CD information.

As is further shown in FIG. 6B as a principal sketch, a substrate 14, which may be similar to the substrate 1 of the previous figures, exhibits parallel PC lines 13, which may be similar to parallel PC lines 3 of FIGS. 1B and 2B. Further, FIG. 6B shows CD area 17. FIG. 6C shows a corresponding image with a substrate 14', parallel PC lines 13' on the substrate 14', and a CD area 17'. The areas 18 of FIG. 6B and 18' of FIG. 6C denote a nominal, e.g., real region corresponding to the CD area 17 and 17'. Thus, the CD area 17' may serve for measuring length and width, e.g., two-dimensional precise information on CD. Thus, it enables inline CT mask monitoring after a hard mask open step with an improved visibility. Thus, inline CT measurement on critical dimension (CD) size after hard mask open may be provided with high image resolution.

The measurement result of FIG. 6C may be combined with tip-to-tip measuring and an improved understanding of tip-to-tip bridging mechanism may be achieved.

Figure 7:
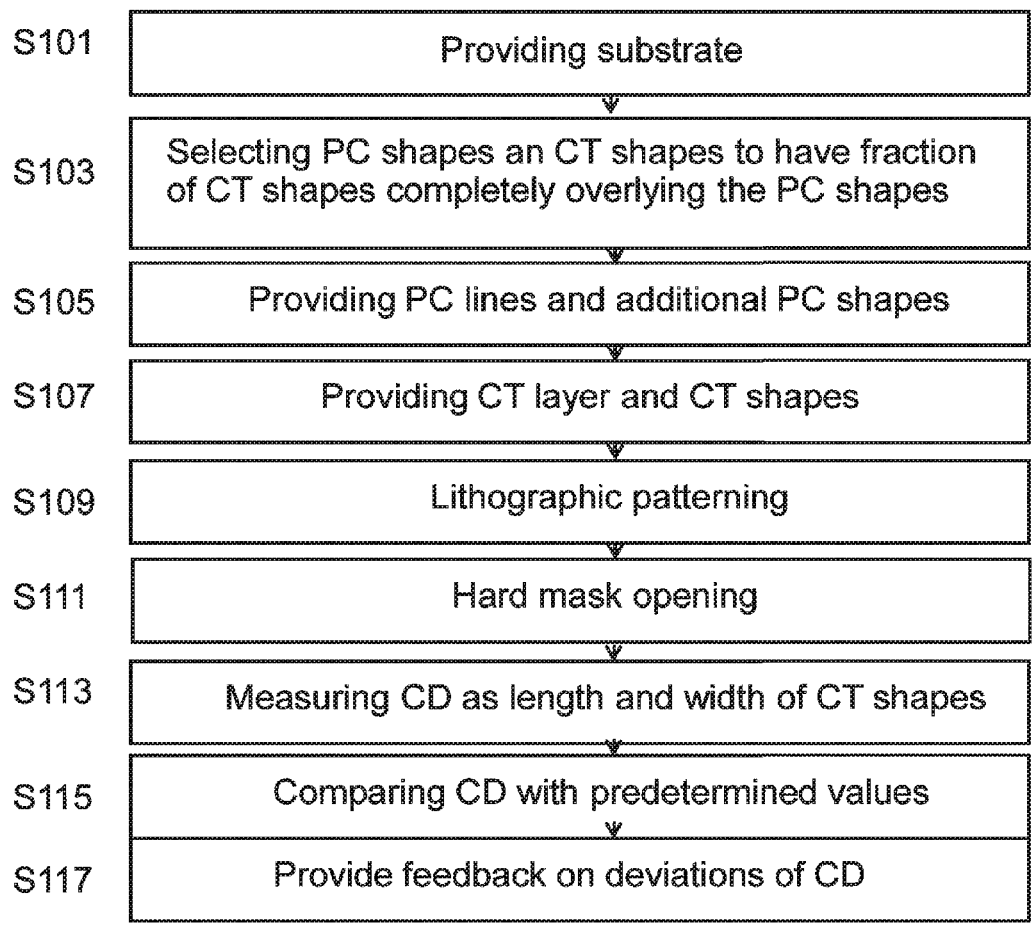
FIG. 7 illustrates a sequential flow of the method of the present disclosure.

FIG. 7 gives a sequential flow of the method of the present disclosure. In step S101, a substrate is provided as is shown in FIGS. 1A, 1B and 2A, 2B. In step S103, before providing PC lines 3 and additional PC shapes 5 of FIGS. 2A and 2B, it is considered to have a predetermined fraction of PC shapes 5 selected such that in further step S107 and after S109, CT shapes 7 will completely overlie the PC shapes 5 as is explained with respect to FIG. 4.

In step S105, taking into account the consideration of step S103, the PC pattern, i.e., PC lines 3 and PC shapes 5, are provided, see FIGS. 2A and 2B.

In step S107, the CT layer 6 and CT shapes 7 are provided as explained and depicted with regard to FIGS. 3A, 3B and 4. In particular, owing the consideration step S103, a predetermined fraction of CT shapes 7 will completely overlie the PC shapes 5.

In step S109, lithographic patterning takes place. In step S111, a hard mask opening step is performed, thereby at least partially removing the mask layer 6 of FIGS. 3A and 3B, and optionally thinning the PC layer.

In step S113, the measuring of the CD shapes as explained with respect to FIGS. 6A-6C is performed.

In step S115 of the monitoring process, monitoring dimensions of the CT shapes, i.e., area 18', may further include comparing the length and the width of the CT shapes with predetermined values of the length and the width of the CT shapes. The predetermined values of the length and the width of the CT shapes correspond to simulated values and/or previously determined values.

In step S117, in case the measured length and width of the CT shapes are determined to be larger than the simulated values and/or previously determined values, i.e., they deviate from expected values, a feedback may be given such that the wafer may be discarded or the tools used for processing the wafer are inspected before further processing of other wafers.

The step of monitoring dimensions of the CT shapes may further include measuring tip-to-tip bridging of PC lines.

Optionally, the step of monitoring dimensions of the CT shapes further may include conducting a scan to provide contamination-free manufacturing data (CFM) to correlate the dimensions of the CT shapes with tip-to-tip bridging data, so as to provide an improved understanding of the tip-to-tip bridging mechanism together with determining CD parameters.

The above monitoring process may be implemented in all technologies. No change of the CT layer parameters may be necessary. In addition, no change of the lithography process is required, the lithography process may just remain the same. Only layout changes for the PC layer may be needed.

In summary, a high precision inline CT measurement on critical feature sizes after hard mask opening (HMO) and final etch is provided. The development and inline control of CT lithography and HMO etching may be developed. The process may be integrated into a full flow production process, by applying the process on test structures as described above as a pre- or post-production control step.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of monitoring critical dimensions of gate electrode structures comprising:
   providing a semiconductor substrate;
   forming a gate electrode pattern on the substrate comprising forming gate electrode lines parallel to each other;
   forming a mask layer on the gate electrode pattern and forming openings in the mask layer, in a crosswise direction with respect to the direction of the parallel gate electrode lines, thereby exposing portions of the gate electrode pattern;
   etching exposed portions of the gate electrode pattern through the mask layer openings, thereby obtaining a negative image of the mask layer openings;
   removing remaining portions of the mask layer; and
   monitoring dimensions of the mask layer openings;
   wherein forming the gate electrode pattern comprises forming additional gate electrode shapes in a crosswise direction with regard to the parallel gate electrode lines, the additional gate electrode shapes being geometrically similar to and having a larger area than the mask layer openings such that a predetermined fraction of the mask layer openings completely overlie the additional gate electrode shapes when forming the mask layer openings.

2. The method according to claim 1, wherein the gate electrode lines have a uniform pitch.

3. The method according to claim 1, wherein the material of the gate electrode pattern comprises at least one of polysilicon, amorphous silicon, nitrides, oxides, metal silicide or metals.

4. The method according to claim 1, wherein the material of the mask layer comprises at least one of a photo resist, a planarization layer, an antireflective layer, or a hardmask.

5. The method according to claim 1, wherein the mask layer covers the entire gate electrode pattern on the substrate.

6. The method according to claim 1, wherein the predetermined fraction of the mask layer openings which completely overlies the additional gate electrode shapes is between 5%-50%.

7. The method according to claim 6, wherein the predetermined fraction of mask layer openings is randomly distributed over the gate electrode pattern.

8. The method according to claim 1, wherein the mask layer openings are at least partially matched to functional SRAM or logic patterns.

9. The method according to claim 1, wherein each of the additional gate electrode shapes has a substantially rectangular shape with a width in crosswise direction of a multiple of a pitch size and a length in lengthwise direction larger than a corresponding width of the mask layer openings.

10. The method of claim 9, wherein the corners of the gate electrode shapes are chamfered.

11. The method of claim 1 wherein the step of forming the mask layer on the gate electrode pattern includes lithographic patterning a prepared mask.

12. The method of claim 1, wherein the step of monitoring dimensions of the mask layer openings includes measurement of the length and the width of the mask layer openings.

13. The method of claim 12, wherein the step of monitoring dimensions of the mask layer openings further includes comparing the length and the width of the mask layer openings with predetermined values of the length and the width of the mask layer openings.

14. The method of claim 13, wherein the predetermined values of the length and the width of the mask layer openings correspond to simulated values and/or previously determined values, wherein in case the measured length and width of the mask layer openings are determined to be larger than the simulated values and/or previously determined values, a feedback may be given such that the wafer may be discarded or tools used for processing the wafer are inspected before further processing of other wafers.

15. The method of claim 1, wherein the step of monitoring dimensions of the mask layer openings further includes measuring tip-to-tip bridging of gate electrode lines.

16. The method of claim 1, wherein the step of monitoring dimensions of the mask layer openings further includes conducting a scan to provide contamination free manufacturing data to correlate the dimensions of the mask layer openings with tip-to-tip bridging data.

17. The method of claim 1, wherein the semiconductor substrate is one of a silicon on insulator and fully depleted silicon on insulator substrate.

* * * * *